United States Patent [19]

Crepeau

[11] 4,249,302
[45] Feb. 10, 1981

[54] MULTILAYER PRINTED CIRCUIT BOARD

[75] Inventor: Philip C. Crepeau, San Diego, Calif.

[73] Assignee: NCR Corporation, Dayton, Ohio

[21] Appl. No.: 974,164

[22] Filed: Dec. 28, 1978

[51] Int. Cl.³ .......................... H05K 1/12; H05K 1/14
[52] U.S. Cl. ........................................ 29/830; 29/852;
156/625; 156/901; 339/17 B; 339/17 M;
361/414; 427/97; 428/901; 428/138
[58] Field of Search ...................... 428/901; 174/68.5;
339/17 M, 17 E, 17 B; 361/397, 413, 414, 416;
427/97; 29/852, 842, 843, 845, 830; 156/901,
625

[56] References Cited

U.S. PATENT DOCUMENTS

| 3,028,573 | 4/1962 | Stoehr | 339/17 E |
| 3,157,857 | 11/1964 | Stapper et al. | 339/17 E |
| 3,323,198 | 6/1967 | Shortes | 29/852 |
| 3,436,819 | 4/1969 | Lunine | 427/97 X |
| 3,541,222 | 11/1970 | Parks et al. | 339/17 R |
| 3,780,352 | 12/1973 | Redwanz | 174/52 H X |
| 3,880,486 | 4/1975 | Avakian | 339/17 M |
| 3,904,934 | 9/1975 | Martin | 339/17 M X |
| 3,971,610 | 7/1976 | Buchoff et al. | 339/17 R |

OTHER PUBLICATIONS

Webster's New World Dictionary, definition of "engage", p. 463, 2nd Edition, 1972.

Primary Examiner—George F. Lesmes
Assistant Examiner—Alexander S. Thomas
Attorney, Agent, or Firm—J. T. Cavender; Edward Dugas; Stephen F. Jewett

[57] ABSTRACT

A multilayer printed circuit board having a pad pattern formed on each of the layers. When the board is assembled, the layers are releasably secured together. The pads on each layer are aligned and make electrical contact with the pads on adjacent layers to provide interlayer electrical connections.

4 Claims, 4 Drawing Figures

U.S. Patent  Feb. 10, 1981  Sheet 2 of 2  4,249,302
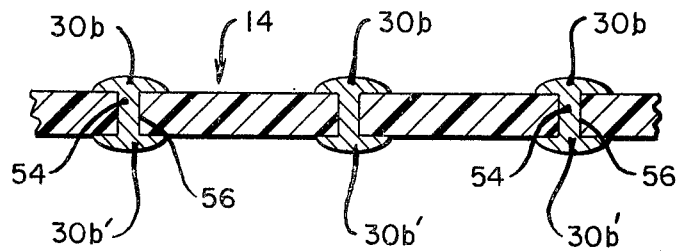
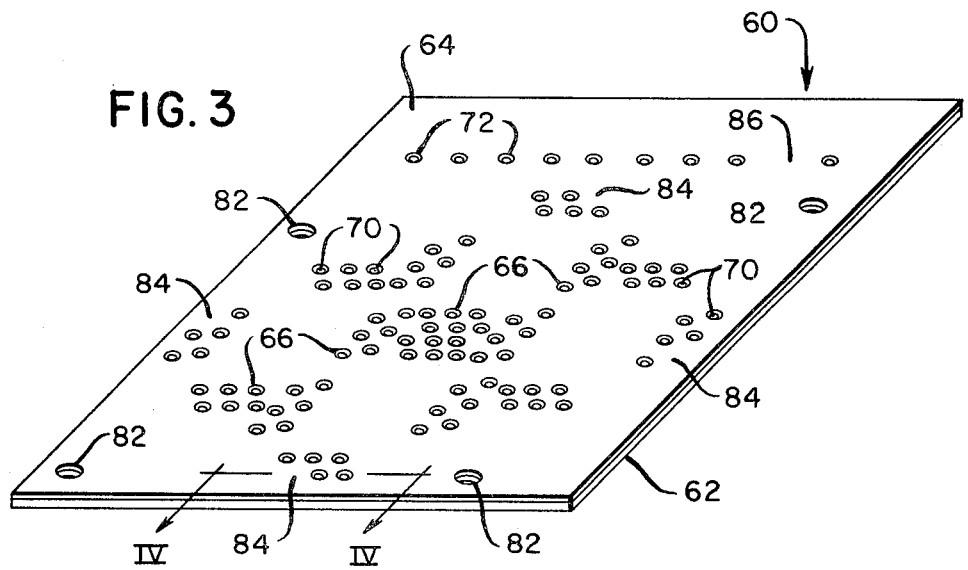
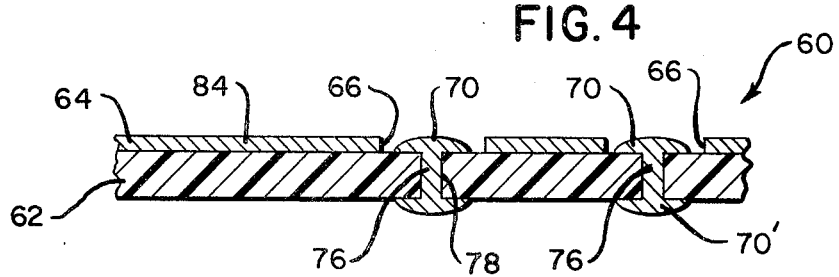

MULTILAYER PRINTED CIRCUIT BOARD

BACKGROUND OF THE INVENTION

The present invention relates to printed circuit boards, and more particularly, to multilayer printed circuit boards for mounting and interconnecting electronic devices, such as LSI (large scale integration) and VLSI (very large scale integration) devices in a data processing system.

Multilayer printed circuit boards are generally manufactured by bonding stacks or sheets of substrates of insulating material having printed conductor or wiring patterns on their faces. The printed conductor patterns may be formed on each layer separately, and then the layers may be assembled and the printed conductor patterns on the layers electrically interconnected by employing plated-through holes or the like. Plated-through holes are usually formed by drilling the assembled layers or boards and plating the entire length of the drilled hole with copper or another conductor to effect the interconnection.

Alternatively, multilayer printed circuit boards have been formed by starting with a first substrate, forming a conductor pattern on that substrate, forming a second substrate directly over the first substrate and forming a conductor pattern on the second substrate, and continuing thereon until the desired number of layers have been formed.

Two common difficulties often arise in the design and manufacture of multilayer printed circuit boards that are used in mounting and interconnecting LSI and VLSI devices. Because of the large amount of circuitry within and the large number of external leads on these devices, there is often difficulty in trying to provide, during the design of the multilayer board, adequate electrical paths or connections between layers without using significant amounts of circuit board area which might otherwise be used to route printed conductor patterns. Where plated-through holes provide the electrical connections between layers, a hole of sufficient size must be drilled or otherwise made through each of the layers so that there can be enough plating material used to form an adequate electrical connection between all of the desired layers.

Another difficulty that often arises is that in multilayer boards, especially boards for mounting and connecting LSI and VLSI devices and thus having a large number of conductive patterns on the layers, an improper connection or other defect on any one of the layers makes the entire multilayer board unusable. Since the fabrication of a multilayer board is generally expensive both in design and production costs, the necessity of discarding a board because of a defect or a circuit design change on only one layer further increases an already high cost.

In U.S. Pat. No. 3,780,352, issued to James O. Redwanz on Dec. 18, 1973, there is disclosed a multilayer printed circuit board comprised of thin, flexible sheets for connecting semiconductor chips in an integrated circuit package. The Redwanz patent does not, however, disclose a printed circuit board which might be used, for example, in a data processing system where a number of electronic devices are mounted on the board for electrical interconnection, nor does it deal with solving the difficulty when a defect or a design change occurs with respect to only one of the layers.

In U.S. Pat. No. 3,028,573, issued to Rudolph O. Stoehr on Apr. 3, 1962, there is disclosed a multilayered printed circuit board with the layers secured together by nuts and bolts. The circuit board in Stoehr could thus be disassembled by removing the nuts and bolts. However, unlike modern multilayer printed circuit boards, the Stoehr printed circuit board includes insulating layers between the layers having the conductor patterns, and uses removable pins for providing interlayer electrical connections. The printed circuit board in Stoehr would not be suitable for the complex and significant number of interconnections required in printed circuit boards used for mounting and interconnecting LSI and VLSI devices in data processing systems.

SUMMARY OF THE INVENTION

In accordance with the present invention, there is provided a multilayer printed circuit board for use with LSI or VLSI devices having a plurality of layers, each layer with a conductive wiring and pad pattern thereon. The pad pattern extends through to both sides of each layer and the patterns on the layers are aligned with the layers are assembled so that the conductive pads on each layer make contact with the conductive pads on each adjacent layer and provide electrical connections between the layers. The layers are secured together by releasable means so that if desired, one of the layers may be removed or replaced.

The pads on the circuit board layers are formed by small perforations or holes and conductive plating material through and on both sides of the board at the perforations. The pads are formed prior to assembly of the layers so that it is unnecessary to drill through several layers and form plated-through holes electrically interconnecting the layers.

The use of pads in accordance with the present invention for providing electrical connections between layers minimizes the space or surface area on the multilayer circuit board used for interlayer electrical connections. As a result, more surface area is available for conductive wiring patterns and thus the circuit density of the multilayer board and the number of electronic devices mounted on the board can be increased. Also, the forming of the pad and wiring patterns in the manner described permits the inclusion in the multilayer circuit board of relatively thin and flexible layers which are secured and compressed together by outer, more rigid, circuit board layers. The ability to use layers of various dielectric thickness, and to intersperse them with conductive "ground" or "power" planes or layers gives the designer of the circuit board control over the amount of impedance which the electrical signals on the printed wiring patterns will encounter.

It is therefore an object of the present invention to provide an improved multilayer printed circuit board.

It is a further object of the present invention to provide a multilayer printed circuit board in which interlayer electrical connections are formed without plated-through holes extending through all of the layers.

It is still a further object of the present invention to provide a multilayer printed circuit board in which the layers are releasably secured together so that one or more layers may be removed or replaced if necessary.

It is still a further object of the present invention to provide a multilayer printed circuit board where the dielectric thickness of the signal layers may be varied to meet the impedance requirements of the board.

Still a further object of the present invention is to provide a multilayer printed circuit board with increased circuit density, obtained by minimizing the amount of circuit board area dedicated to inter-layer connections and permitting the addition of layers when further printed circuit patterns are required.

These and other objects of the present invention will become more apparent when taken in conjunction with the following description and the attached drawings.

BRIEF DESCRIPTION OF THE DRAWINGS

FIG. 2 is a fragmentary sectional view of one layer of the multilayer printed circuit board taken along the line II—II in FIG. 1.

FIG. 3 is a perspective view of a power or ground layer which may be used in the multilayer printed circuit board of FIG. 1.

FIG. 4 is a fragmentary sectional view of the power or ground layer taken along the line IV—IV in FIG. 3.

DESCRIPTION OF THE PREFERRED EMBODIMENT

Figure 1:
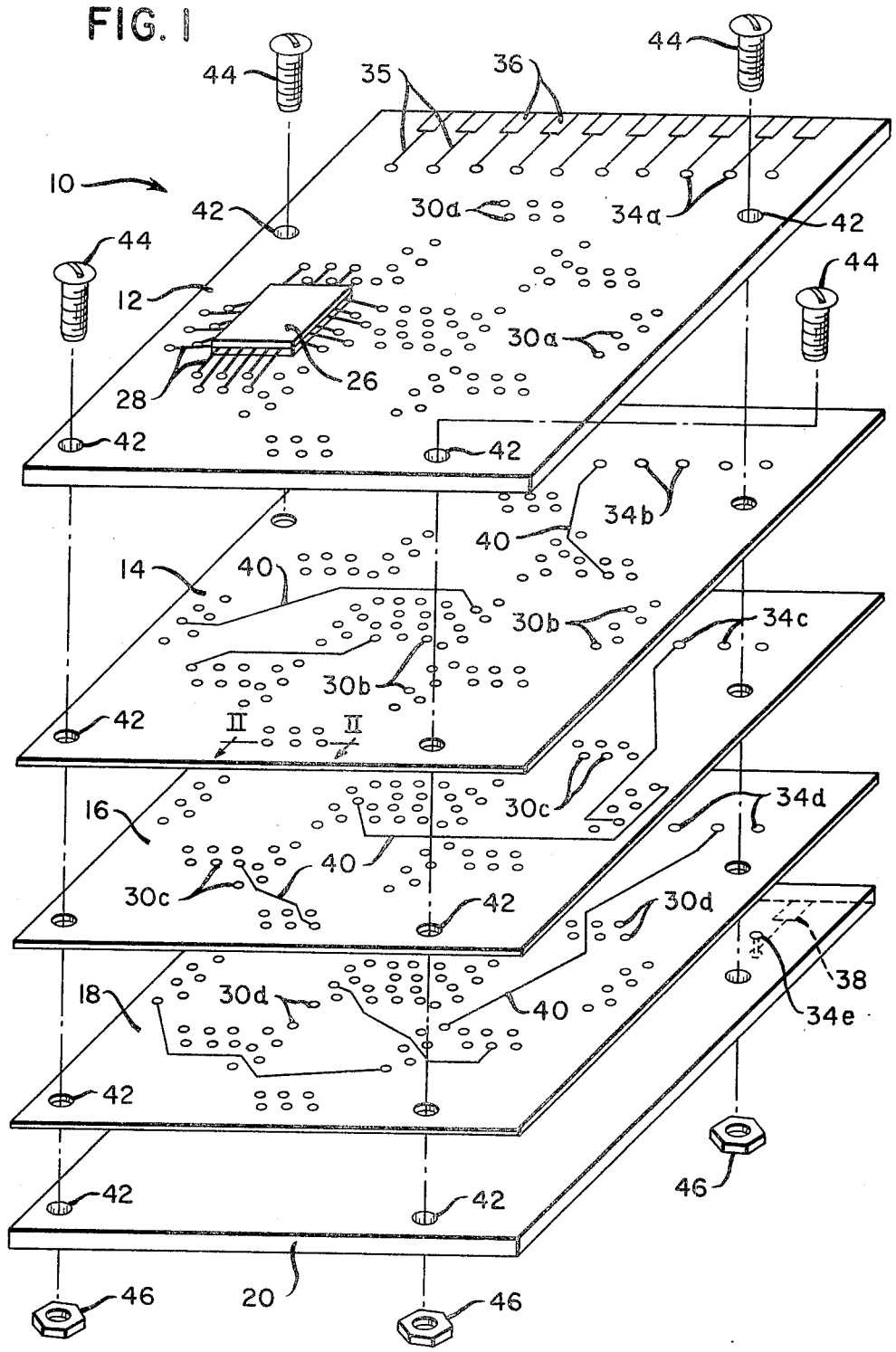
FIG. 1 is an exploded perspective view of a multilayer printed circuit board in accordance with the present invention.

Referring now to FIG. 1, there is shown a multilayer printed circuit board 10 in accordance with the present invention. The printed circuit board 10 includes a rigid component layer 12, three signal layers 14, 16 and 18, and a rigid bottom layer 20. The signal layers 14, 16 and 18 are relatively thin and flexible, and, as will be described more fully later, when the multilayer printed circuit board 10 is fully assembled, the signal layers 14, 16, and 18 are sandwiched between the component layer 12 and the layer 20 in order to form a single, relatively rigid, structure.

In the illustrated embodiment, the purpose of the printed circuit board (PCB) 10 is to mount and interconnect circuit devices, such as LSI and VLSI devices in a data processing system. One such device 26 is illustrated in FIG. 1, and space is provided on component layer 12 for three additional such devices. The device 26 is packaged in a structure commonly referred to in the art as a "flat pack". The device 26 has a plurality of leads 28 extending from its four sides for carrying various signals and power and ground voltages to the circuitry within the device. The leads 28 are connected, such as by solder, to a plurality of electrical contact pads 30a located on the face of the component layer 12.

It should be noted that although the PCB 10 is shown for mounting only four circuit devices, the actual number of devices per board is unimportant for purposes of the present invention. There are, in fact, normally many devices per board and many such boards in a data processing system.

As seen in FIG. 1, the signal layers 14, 16 and 18 have electrical contact pads 30b, 30c and 30d corresponding to the pads 30a on component layer 12, which are so situated that when the PCB 10 is assembled the pads on each layer align. As will be more fully described later, each of the pads 30a, 30b, 30c, and 30d extend through their associated circuit board layers so that when the PCB 10 is assembled, the aligned pads make electrical contact, with each of the pads 30a on layer 12 electrically connected to a corresponding one of each of the pads 30b, 30c, and 30d.

In addition to the pads 30a, the layer 12 has a row of electrical contact pads 34a which are connected by printed electrical conductors 35 to a set of external terminals 36 located along the far end of the layer 12, as viewed in FIG. 1. The pads 34a make electrical contact to corresponding contact pads 34b, 34c, 34d and 34e on the layers 14, 16, 18, and 20, respectively. As illustrated in phantom in FIG. 1, a set of external terminals 38 may also be located on the underside of the far end of layer 20.

As is conventional, the external terminals 36 and 38 are so located along the PCB 10 when assembled that they may engage an external PCB connector (not shown), such as one would find on the back panel within a computer housing.

Also shown in FIG. 1 are printed conductors 40 on the signal layers 14, 16 and 18 which electrically interconnect various ones of the pads 30b, 30c, or 30d, and which also connect various ones of the pads 30b, 30c and 30d to the pads 34b, 34c and 34d. For simplification, only a few conductors 40 are illustrated on each layer. However, it should be appreciated that in actual practice, especially in a PCB mounting LSI and VLSI devices, there will be many conductors 40 on each of the layers located between and around the pads 30b, 30c, 30d, 34b, 34c and 34d. The conductors 40 are formed in any one of several conventional methods well-known in the art, such as by depositing conductive metal paths or etching away unwanted areas of conductive metal bonded to the layers.

The layers 12, 14, 16, 18 and 20 have a plurality of aligned holes 42 so that bolts 44 may be passed through the layers. Nuts 46 are threaded onto the bolts 44 in order to releasably hold or secure the layers of the PCB 10 together. When so secured, the layers form a single, rigid structure and the aligned pads 30a, 30b, 30c and 30d, and the aligned pads 34a, 34b, 34c, 34d and 34e are brought into electrical contact as described earlier. The holes 42 are located near each of the corners of the PCB 10, but are somewhat staggered in their positions so that if the PCB 10 is disassembled, it may be easily reassembled with the contact pads properly aligned.

It should be apparent from the foregoing that when the PCB 10 is used in a data processing system, electrical signals can be delivered to any one of the external terminals 36 and 38 on the layers 12 and 20. The signals are routed to the pads 34a, 34b, 34c, 34d and 34e, and then by the conductors 40 to any aligned set of the pads 30a, 30b, 30c and 30d. The signals from the pads 30a are carried to the devices mounted on layer 12 (such as the illustrated device 26) by the leads 28.

FIG. 2 illustrates in detail three of the pads 30b on layer 14. It can be seen that each pad 30b includes a connecting portion 54 formed within an aperture 56 in layer 14 and extending through the layer to a pad 30b'. The pads 30b, including each connecting portion 54 and pad 30b', are formed by perforating or drilling the layer 14 in order to make each aperture 56, with all the apertures 56 arranged to correspond to the desired pad pattern. As is conventional with multilayer plated-through holes, the deposit of conductive material at the apertures 56 to form the pads may take several steps, including electroless plating to form a sleeve in each aperture, electroplating to build up the conductive material, and reflowing the conductive material (for example, by immersion of the layer in hot oil) after photoetching the layer.

Each of the pads 30a, 30c and 30d, and the pads 34a, 34b, 34c, 34d and 34e also have connecting portions and associated pads on the underside of their respective layers, and are formed in the same fashion as pad 30b as illustrated in FIG. 2.

It can be seen that by forming the pads as illustrated in FIG. 2, and securing the layers 12 through 20 together so that the aligned pads make electrical contact, the need for conventional plated-through holes extending through several or all of the layers is eliminated. A plated-through hole extending through several layers necessarily requires a relatively large diameter since the plating in the hole must extend through and form a good electrical contact to each of the connected layers. Thus, by use of the pads in PCB 10 rather than plated-through holes, a larger amount of the surface area of the multilayer PCB 10 is available for routing printed conductor patterns and increased circuit density is thereby obtained.

Furthermore, the pads on PCB 10 are of such construction that they may optionally be formed without building up the conductive material be electroplating. When electroplating is not necessary, the thin signal layers 14, 16 and 18 may be formed on a substrate of material, such as TEFLON, having a low dielectric constant. The ability to use a material having a low dielectric constant permits greater control over the impedances encountered by the signals on the conductor patterns on the signal layers.

It should be noted that if it is desired to change the design of the printed conductor pattern on any layer or to add an additional layer after the PCB 10 is assembled, or if it is discovered that one of the layers is defective, the nuts 46 may be removed, and the particular layer may be replaced or added, whichever the case may be.

FIGS. 3 and 4 illustrate a power or ground layer 60 that could be used with the multilayer PCB 10 of FIG. 1. The layer 60 includes an insulating substrate 62 and a layer 64 of conductive material, such as copper, bonded to the substrate 62. The conductive layer 64 has annular or ring-like portions 66 etched away in order to expose the substrate 62 and electrically isolate a plurality of contact pads 70 and a row of contact pads 72. The pads 70 and 72 are formed in a pattern to align with the pads 30a through 30d and the pads 34a through 34e, respectively. The pads 70 and 72 are formed in the same fashion as the pads on layers 12 through 20, and each includes a connecting portion 76 extending through an aperture 78 in substrate 62 to a pad 70' on the underside of layer 60.

The layer 60 has holes 82 through which the bolts 44 (FIG. 1) may pass so that layer 60 can be assembled between any of the layers 12 through 20.

There are, as shown in FIGS. 3 and 4, certain locations 84 on layer 60 which do not have pads 70 but which align with the pads on the other layers. When the multilayer PCB is assembled, the pads on the adjacent layers are electrically connected to the conductive layer 64 at each of these locations 84. Furthermore, one of the pads 72 is missing at a location 86 so that if a power or ground voltage is supplied to one of the terminals 36, the voltage may be connected to the conductive layer 64 at the location 86, and thereby be connected to the pads in the board which align with and electrically contact the conductive layer 64 at each of the locations 84.

Although a specific embodiment of the invention has been shown in detail, it will be understood by those skilled in the art that various changes may be made in form and details without departing from the spirit and scope of the invention.

What is claimed is:

1. A method for producing a multilayer printed circuit board having a reduced amount of surface area on the multilayer printed circuit board required for electrical contact between the layers and, in turn, an increased amount of surface area on the multilayer printed circuit board available for routing printing conductor patterns, comprising:

providing a plurality of signal layers, each signal layer having a pattern of conductive pads and a pattern of printed conductors, the pads formed by perforating the signal layers to make apertures on each signal layer corresponding to the pattern of conductive pads, and depositing conductive material at the apertures using plated-through hole steps so that pads are formed on opposite sides of each signal layer at each aperture and a connecting portion extends through each aperture electrically connecting the pads; and then releasably securing the signal layers to each other so that the pads on one of the signal layers directly contact the corresponding pads on an adjacent one of signal layers.

2. The method of claim 1, wherein the signal layers are thin and flexible, wherein the method further comprises providing two rigid outer layers, and wherein the step of securing the signal layers further comprises securing the signal layers between the two rigid outer layers.

3. The method of claim 1, further comprising:
providing a voltage layer, the voltage layer produced by
providing an insulating substrate,
bonding a conductive layer to the substrate, and
etching the conductive layer to form etched away annular portions each defining a pad in alignment with one of the pads on the signal layers when the signal layers are secured; and
securing the voltage layer to the signal layers.

4. The method of claim 3, wherein the step of etching away includes providing locations on the conductive layer not having an etched away annular portion so that the conductive layer is in electrical contact at that location with an aligned one of the pads on the signal layers.

* * * * *